United States Patent [19]
Garfunkel et al.

[11] Patent Number: 5,508,614
[45] Date of Patent: Apr. 16, 1996

[54] NON-CONTACT METHOD FOR TESTING FOR MR SHIELD SHORT CIRCUITS

[75] Inventors: Glen A. Garfunkel, Palo Alto; Donald E. Horne, San Jose; Robert L. Smith, Cupertino, all of Calif.

[73] Assignee: International Business Machines Corporation, Armonk, N.Y.

[21] Appl. No.: 450,751

[22] Filed: May 25, 1995

[51] Int. Cl.$^6$ ................................ G01R 33/20
[52] U.S. Cl. .................. 324/318; 324/322; 324/526
[58] Field of Search ..................... 324/300, 307, 324/309, 310, 311, 312, 313, 314, 318, 322, 500, 512, 525, 526, 528

[56] References Cited

U.S. PATENT DOCUMENTS

3,911,899  10/1975  Hattes ............................ 128/653.1
4,992,737  2/1991  Schnur ............................ 324/318

*Primary Examiner*—Michael Tokar
*Attorney, Agent, or Firm*—Baker, Maxham, Jester & Meador

[57] ABSTRACT

The present invention provides a test circuit and method for testing for short circuits in an MR head, merged MR head or piggyback MR head without contacting either of the shield layers. This is accomplished by a bridge circuit which employs part of the components of the head. The bridge circuit has four consecutively arranged branches which are interconnected by four consecutively arranged terminals. The first terminal comprises the substrate or one of the write pads and the second and fourth terminals comprise the first and second read pads. A signal generator is connected across the first and third terminals and a detector, such as a differential amplifier, is connected across the read pads. With this arrangement the first branch of the bridge circuit includes a capacitance which is formed by one of the gap layers between one of the shield layers and a first one of the leads and the second branch of the bridge circuit includes a capacitance which is formed by said one of the gap layers between said one of the shield layers and a second one of the leads. The differential amplifier detects any impedance imbalance in the bridge circuit which indicates that coupling between one or more of the shields and one or more of the leads has changed. Most likely the head has a shield short circuit and can be discarded.

35 Claims, 5 Drawing Sheets

FIG. 5 (Substrate Injection)

FIG. 6 (Substrate Injection)

FIG. 7 (Write Head Injection)

NON-CONTACT METHOD FOR TESTING FOR MR SHIELD SHORT CIRCUITS

BACKGROUND OF THE INVENTION

1. Field of the Invention

The present invention relates to a bridge circuit and method for testing for MR (magnetoresistive) shield short circuits and more particularly to a bridge circuit and method for testing for short circuits between lead and shield layers of a thin film MR read head that does not require direct electrical contact to the shield.

2. Description of the Related Art

A thin film MR head employs a magnetoresistive (MR) sensor for reading information signals from a moving magnetic medium, such as a rotating magnetic disk. First and second leads are employed for connecting the MR sensor to first and second externally located read pads. A sense current is applied to the MR sensor via the read pads. Magnetic fields from the magnetic medium cause resistance changes in the MR sensor. The resistance changes cause potential changes across the read pads which are sensed by a detector, such as a differential amplifier. The output of the detector is the readback signal.

The shields prevent destructive interference of the magnetic field from adjacent transitions in the media (a.k.a. ISI or intersymbol interference). Accordingly, the MR sensor and the first and second leads are sandwiched between first and second insulation gap layers and the first and second gap layers are sandwiched between first and second shield layers. The MR head, which comprises the MR sensor, literally "flies" with respect to a rotating magnetic disk, supported by a thin cushion of air that the disk moves between the disk and the ABS. The thin cushion of air is commonly referred to as an "air bearing." The air bearing provides a first force which is counterbalanced by a second force from a suspension which carries the MR head. The counterbalance can be designed to provide a very small distance ("flying height") between the ABS and the rotating disk, such as 0.075 microns. With this arrangement the MR head can read information from each circular track on a rotating magnetic disk with high resolution.

It is important for high linear density that the MR sensor have good resolution. Resolution is the sharpness of the reading capability of the MR head along the length of a circular track on the rotating magnetic disk. Resolution is dependent upon the flying height and the thickness of the first and second gap layers which separate the MR sensor from the first and second shield layers. Production MR heads typically have very thin first and second gap layers, typically less than 0.5 microns. Because of the thinness of the gap layers there are occasional openings through the gap layers which are referred to as "pinholes". A pinhole or other types of defects can cause an internal shield short between a lead and a shield. If the first gap layer has a pinhole, a shield short can occur between one of the leads and the first shield layer and if the second gap layer has a pinhole a shield short can occur between one of the leads and the second shield layer. Internal shield shorts increase noise pickup and can reduce the amplitude if sense current is shunted to the shields. It is desirable that internal shield shorts be detected during production so that defective heads can be discarded.

An MR head can be used singly or in combination with a write head. Typically a thin film MR head is combined with a thin film write head which has first and second pole pieces that define a gap, the pole pieces terminating in pole tips at the ABS. To write information, magnetic fields are induced into the gap by a coil which is embedded in an insulation stack between the first and second pole pieces and which is a signal current through first and second externally located write pads. A combined MR read head and write head is constructed as a merged MR head or a piggyback MR head. A merged MR head employs the second shield layer as the first pole piece, while the piggyback MR head has a separate second shield layer and a separate first pole piece.

Thin film MR read heads, per se, merged MR heads or piggyback MR heads are typically constructed in rows and columns on a wafer. During wafer construction all of the thin film layers are formed for the heads. The wafer is then separated into rows so that a plurality of heads are aligned in a single row. At the row level the heads are lapped to form the ABS. Lapping can sometimes cause a smearing of the conductive shields between the shields and the MR sensor or leads at the ABS. Such smearing also causes an ABS shield short between the MR circuit and one or more of the shields with the same problems as mentioned hereinabove with respect to pinholes. It would be highly desirable to detect shield shorts at the row level which are caused by pinholes in the gap layers or conductive smearing at the ABS. After testing the row can be diced into individual heads. A portion of the wafer remains and provides an externally located substrate and/or slider for supporting the completed head. It would also be desirable to be able to detect a shield short in a completed head which is mounted on a head gimbal assembly (HGA) for use in a drive, such as a magnetic disk drive.

In the past, extra pads, extra probes and changes in head layout have been employed to accommodate testing for head short circuits during production. As an example holes (vias) have been made in the layers to the shield layers so that external pads can be provided for external testing equipment. The pads can take up extra room on the wafer thus reducing production throughput. Also, there may not be room on the slider which is getting smaller as technology advances. It would be desirable if direct contact with the shield layers could be eliminated when testing for shield short circuits.

SUMMARY OF THE INVENTION

The present invention provides a test circuit and method for testing for shield shorts in an MR head without contacting either of the shield layers. This is accomplished by a bridge circuit which employs part of the components of the head. The bridge circuit has four consecutively arranged branches which are interconnected by four consecutively arranged terminals. The first terminal comprises the substrate or one of the write pads and the second and fourth terminals comprise the first and second read pads. A signal generator is connected across the first and third terminals and a detector, such as a differential amplifier, is connected across the read pads. With this arrangement the first branch of the bridge circuit includes a capacitance, which is formed by one of the gap layers between one of the shield layers and a first one of the leads, and the second branch of the bridge circuit includes a capacitance which is formed by said one of the gap layers between said one of the shield layers and a second one of the leads. The differential amplifier detects any impedance imbalance in the bridge circuit. If this occurs the head most likely has a short circuit and can be discarded. For highest sensitivity, the bridge should be balanced when there are no shorts. That is, the coupling between the first lead and the shields should be equal to the capacitive coupling between the second lead and the shields. This can be done in many ways but is most easily achieved with equal lead areas and gap areas.

OBJECTS OF THE INVENTION

An object of the invention is to provide a device and method for testing an MR head for shield shorts without contacting either of the shield layers.

Another object is to provide a bridge circuit which comprises a portion of an MR head for testing the MR head for internal shield shorts between shield layers and leads.

A further object is to provide a device for testing for shield shorts which can be connected to functional components of a magnetic head.

Yet another object is to provide a device which can be connected to the substrate or one of the write pads and to the read pads of a merged or piggyback MR head for testing the head for shield shorts.

Still another object is to provide a device and method for simplifying head construction, increasing production throughput, and producing more reliable heads.

Other objects and advantages of the invention will become readily apparent upon reading the following description taken together with the accompanying drawings.

DESCRIPTION OF THE PREFERRED EMBODIMENTS

Figure 1:
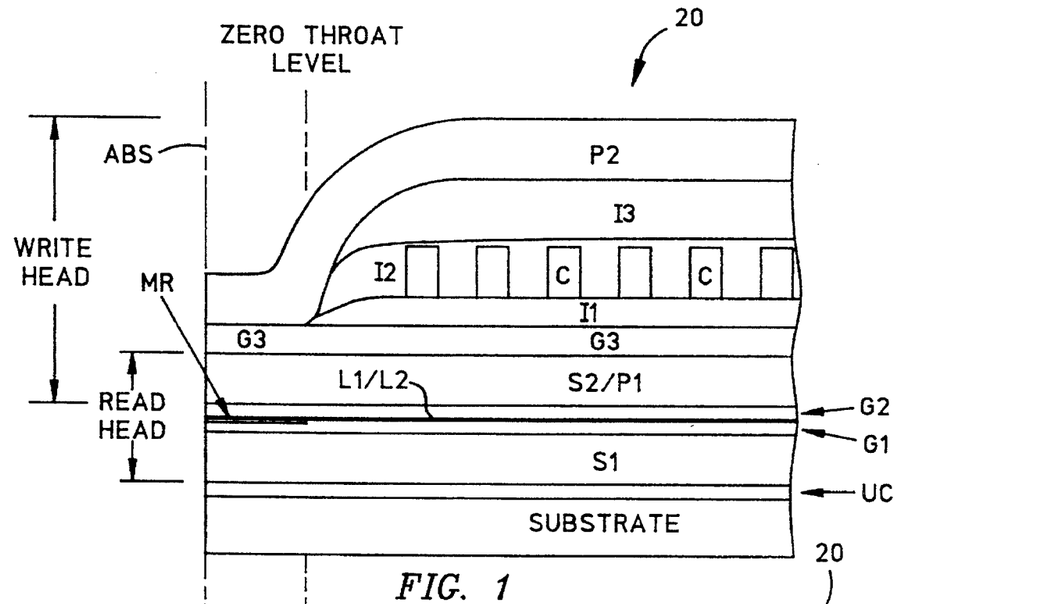
FIG. 1 is an elevational cross-sectional view of a merged MR head.

Referring now to the drawings wherein like reference numerals designate like or similar parts throughout the several views there is shown in FIG. 1 a portion of a merged MR head 20. The merged MR head has an MR sensor MR which is connected at opposite ends (into and out of the drawing) to first and second leads L1 and L2. The MR sensor and the first and second leads L1 and L2 are sandwiched between first and second gap layers G1 and G2 which in turn are sandwiched between first and second shield layers S1 and S2. The gap layers G1 and G2 are kept as thin as practical in order to increase the resolution of the read head portion of the merged MR head 20. The shield layers S1 and S2 reduce intersymbol interference. Because of the thinness of the first and second gap layers G1 and G2 pinholes may occur between these layers during fabrication. As is known, pinholes can cause a short between one or more of the leads L1/L2 and one or more of the shield layers S1/S2. For instance, if there is a pinhole in the first gap layer G1 opposite the first lead L1 and the first shield layer S1 this will cause an internal shield short between the first lead L1 and the first shield layer S1. The first lead L1 then has the potential for picking up noise which decreases the signal to noise ratio. The short circuit can further result in a significant reduction in signal amplitude, such as where two or more shorts shunt the current past the MR element. During production of multiple merged MR heads a percentage of the heads will have pinholes in the first and second gap layers G1 and G2 which will result in internal shield shorts between the leads and the shields. These heads must be identified and discarded from the production run.

In a merged MR head the second shield layer of the read head also serves as the first pole piece P1 of the write head portion. The write head portion includes a coil which is embedded in an insulation stack I1, I2 and I3 which, in turn, is sandwiched between first and second pole pieces P1 and P2. The pole pieces P1 and P2 converge between a zero throat level and the ABS to pole tips which are separated by a third gap layer G3. The coil C induces magnetic potentials into the pole pieces P1 and P2 which induces flux between the pole tips across the third gap layer G3 at the ABS. This causes signals to be written on a moving magnetic medium, such as a rotating magnetic disk.

Figure 2:
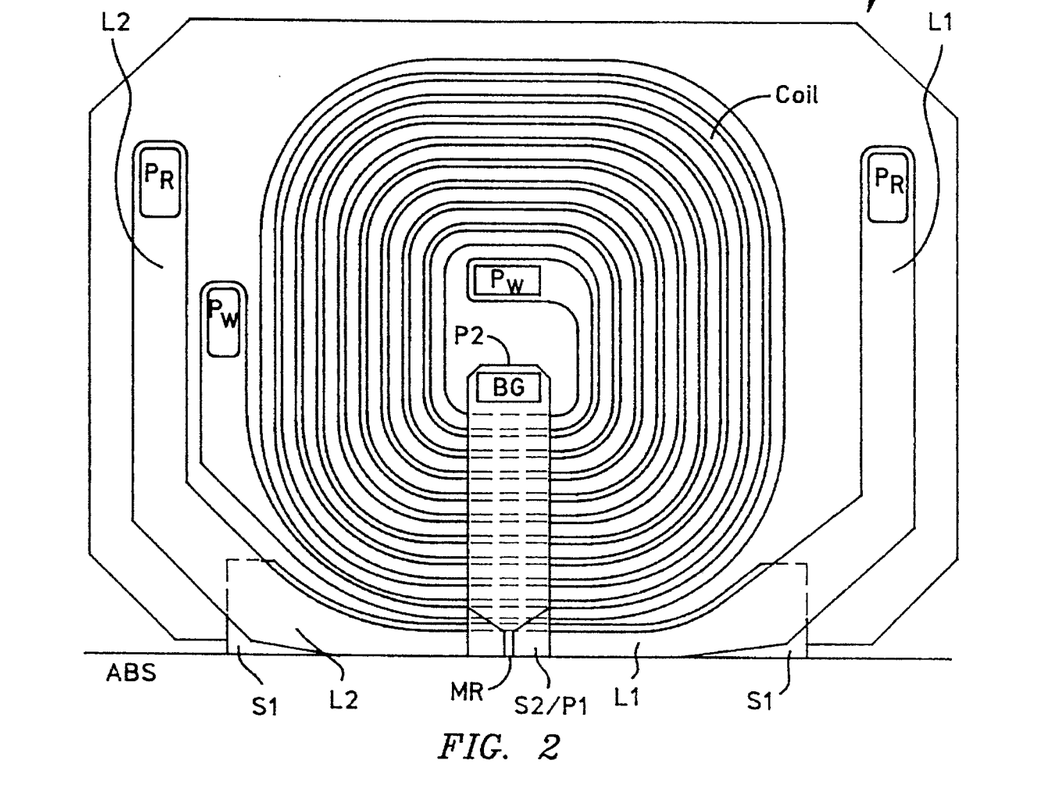
FIG. 2 is a top plan view of the merged MR head with portions broken away to show various details thereof.

As shown in FIG. 2, the coil spirals around a back gap BG which is a rear magnetic connection of the first and second pole pieces P1 and P2. Opposite ends of the coil are connected to write pads $P_W$. The first and second leads are connected at their ends to read pads $P_R$. In a completed head these pads are exposed to the outside environment of the head for connection to read and write devices (not shown). Write signals are introduced into the write pads $P_W$ and read signals are read from the read pads $P_R$. The read device, which is connected to the pads $P_R$, transmits a sense current through the leads and the MR sensor. The read device may include a voltage amplifier, current amplifier or a transconductance amplifier. The reading function is initiated at the MR sensor MR. When a magnetic disk is rotated adjacent the head in contact or a short distance from the ABS the MR sensor senses magnetic fields in circular tracks of the rotating disk. The magnetic fields from the rotating disk cause proportional changes in the resistance of the MR sensor which changes the potential across the pads $P_R$, this potential being detected by the read device as a readback signal.

In a production run literally hundreds of merged MR heads can be constructed in rows and columns on a wafer or substrate, a substrate portion for a single head being shown in FIG. 1. An insulative undercoat UC is employed between the substrate and the first shield layer S1. Various layers above the wafer or substrate are constructed by thin film technology which may include photoresist framing, deposition by sputtering or plating and etching unwanted layer portions. After the layers of the head are formed on the wafer the wafer is sawed into rows so that each row contains a line of magnetic heads. At the row level the substrate and magnetic layers are lapped by a grinding process to form the ABS as shown in FIGS. 1 and 2. This is the surface which the head contacts or flies over or under the moving magnetic disk. During this lapping process conductive material from either of the shield layers S1 or S2 can be smeared to the MR sensor causing an ABS shield short. During production it is also important to detect shield shorts at the ABS so that these heads can be discarded. The ideal time to check for ABS shield shorts is at the row level after lapping since subsequent fabrication steps will not create a shield short problem.

The main purpose of the invention, to be described hereinafter, is for testing for internal shield shorts and ABS shield shorts at the row level during fabrication of the head. However, it is to be understood that the invention can also be used for testing for such shield shorts in individual heads after dicing the row of heads into individual heads. An individual head mounted on a head gimbal assembly (HGA), which may in turn be mounted in a disk drive, can still be checked for internal shield shorts and ABS shield shorts by the present invention. It should also be understood that the present invention can be checked for such shield shorts in a piggyback head or an MR head per se, which would include the read head portion on the substrate shown in FIG. 1. The piggyback MR head is the same as the merged MR head 20 shown in FIG. 1 except the second shield layer S2 and the first pole piece P1 are separate layers instead of being merged together.

It should be noted that the read pads $P_R$, the write pads $P_W$ and the substrate are all exposed to the outside environment at both the row level and individual level of the magnetic head. These are components of the head which are employed by the present invention for testing for shield short circuits and ABS short circuits which will be described in detail hereinafter.

Figure 3:
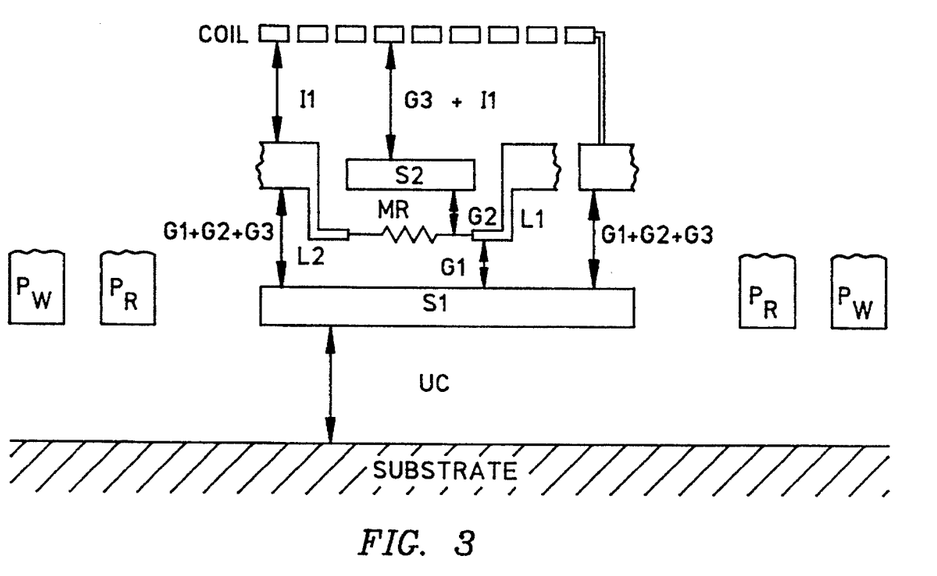
FIG. 3 is a schematic illustration of conductive components of the magnetic head showing capacitive spacing therebetween caused by various thin film insulation layers.
Figure 4:
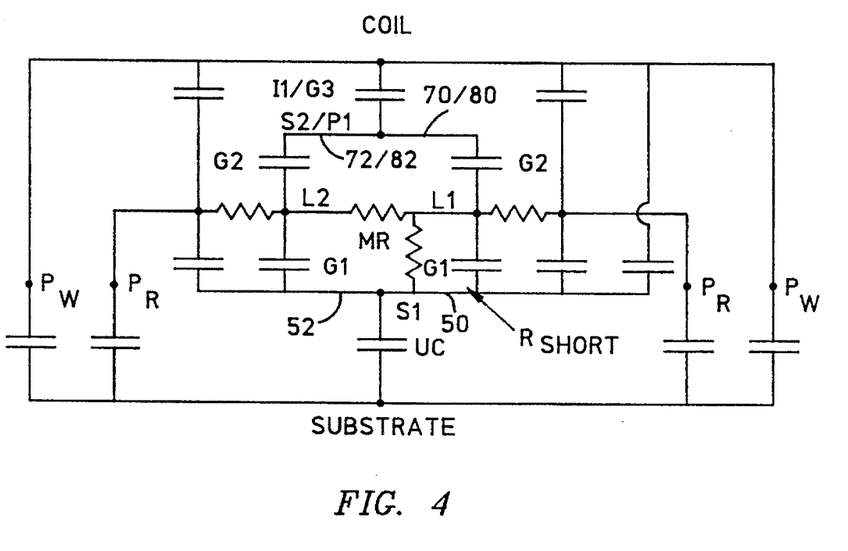
FIG. 4 is a circuit diagram of the components of the magnetic head shown in FIG. 3.

FIG. 3 is a schematic illustration of the various components of the merged MR head 20. The substrate, first shield layer S1, MR, first and second leads L1 and L2, second shield layer S2, the coil, the write pads $P_W$ and the read pads $P_R$ are all conductive elements within the magnetic head. The substrate is typically constructed of titanium carbide, the first and second shields S1 and S2, the MR and the first and second leads are typically constructed of Permalloy and the coil may be constructed of copper. The undercoat layer UC, the first, second and third gap layers G1, G2 and G3 and the insulation layer I1 are insulation layers. The undercoat layer and the gap layers may be constructed of alumina and the first insulation layer I1 may be constructed of baked photoresist. As can be seen from FIG. 3, the insulation layers provide various spacings and therefore various capacitances between the conductive layers of the magnetic head. An electrical schematic illustration of the components of the magnetic head of FIG. 3 is illustrated in FIG. 4. It should be noted that the substrate, which is exposed to the outside environment, is capacitively coupled to the first shield layer by the undercoat UC which is in turn capacitively coupled to the MR and the first and second leads by the first gap layer G1. It should further be noted that the coil, which is in direct contact with the write pads $P_W$, is capacitively coupled to the second shield layer S2 by the insulation layer I1 and the third gap layer G3 and that the second shield layer S2 is capacitively coupled to the MR and the first and second leads L1 and L2 by the second gap layer G2. This arrangement plays an important role in the present invention which is to be described hereinafter.

Figure 5:
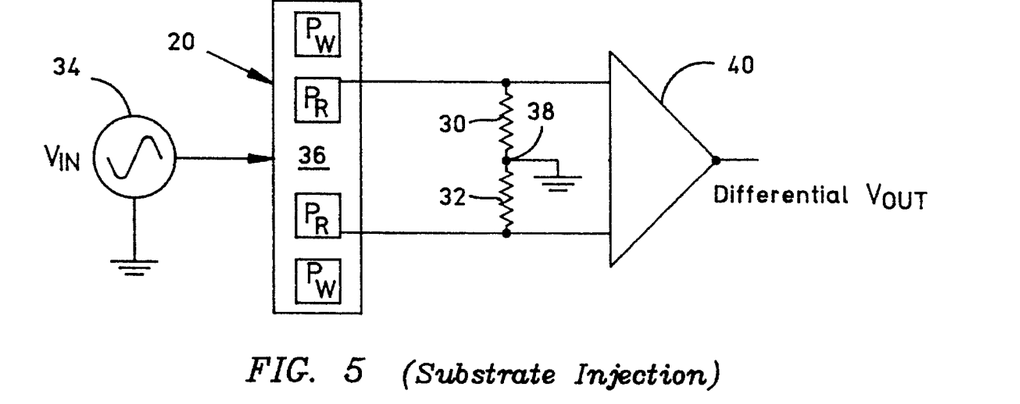
FIG. 5 is a circuit diagram of one embodiment of the present invention which employs substrate injection.

FIG. 5 is a schematic illustration of one embodiment of the present invention which employs substrate injection. The magnetic head is shown at 20 with read pads $P_R$ and write pads $P_W$. The magnetic head 20 may be an individual head possibly mounted in a magnetic disk drive or may still be at the production level in a row of magnetic heads. The circuit shown in FIG. 5 is a bridge circuit wherein certain components of the magnetic head comprise two branches of the bridge circuit. The other two branches of the bridge circuit are shown at 30 and 32. The four branches of the bridge circuit are interconnected by connecting the branches 30 and 32 to the read pads $P_R$. Complete details of the branches of the bridge circuit will be described hereinafter. Substrate injection is accomplished by connecting an AC generator 34 across the substrate 36 (see also FIG. 1) and the terminal connection 38 between the branches 30 and 32. This may be accomplished by connecting the terminal connection 38 of the branches 30 and 32 to ground, connecting one side of the AC generator 34 to the substrate 36 and connecting the other side of the AC generator to ground. A detector 40, such as a differential voltage amplifier, is connected across the branches 30 and 32 for detecting an impedance imbalance within the magnetic head 20 due to shield shorts between the shields on either the leads or the MR sensor. If the resistances 30 and 32 are greater than about 10 ohms the differential voltage amplifier emulates a differential voltage amplifier. However, if the resistances 30 and 32 are each greater than zero but less than about 10 ohms the differential voltage amplifier emulates a differential current amplifier. The invention will work when the resistances 30 and 32 are in a range of greater than zero but less than 10,000 ohms. If there is no resistance in the branches 30 and 32 detection can still be implemented by employing a current probe for each branch 30 and 32 and then detecting the difference between the current probes by a differential amplifier. A current probe is a device which employs a transformer which wraps around the wire to detect the current flowing therethrough.

Figure 6:
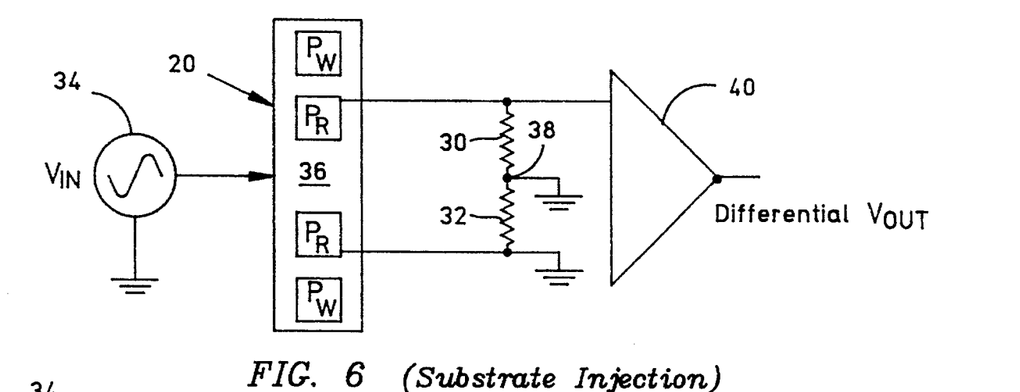
FIG. 6 is a circuit diagram of another embodiment of the present invention which employs substrate injection.

FIG. 6 is similar to FIG. 5 except the connection of the detector 40 across the branches 30 and 32 is slightly modified to detect shield shorts by a common mode signal. In this embodiment one side of the differential amplifier is connected to ground and one of the branches 32 is connected to ground.

Figure 7:
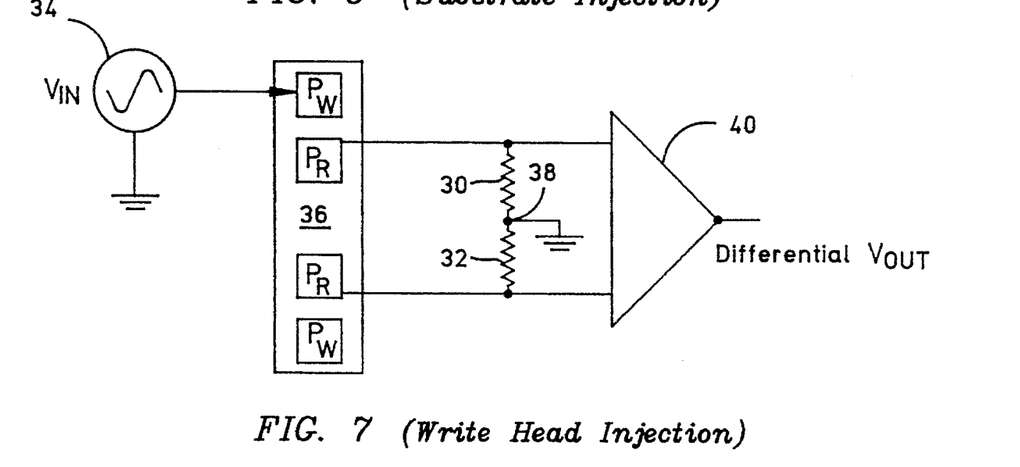
FIG. 7 is a circuit diagram of still another embodiment of the present invention which employs write head injection.

FIG. 7 is the same as FIG. 5 except the AC signal from the generator 34 is injected into one of the write $P_W$ instead of being injected into the substrate 36. When the AC signal is injected into either of the write pads $P_W$ this signal will be directly conducted to the coil which will be described hereinafter.

Figure 8:
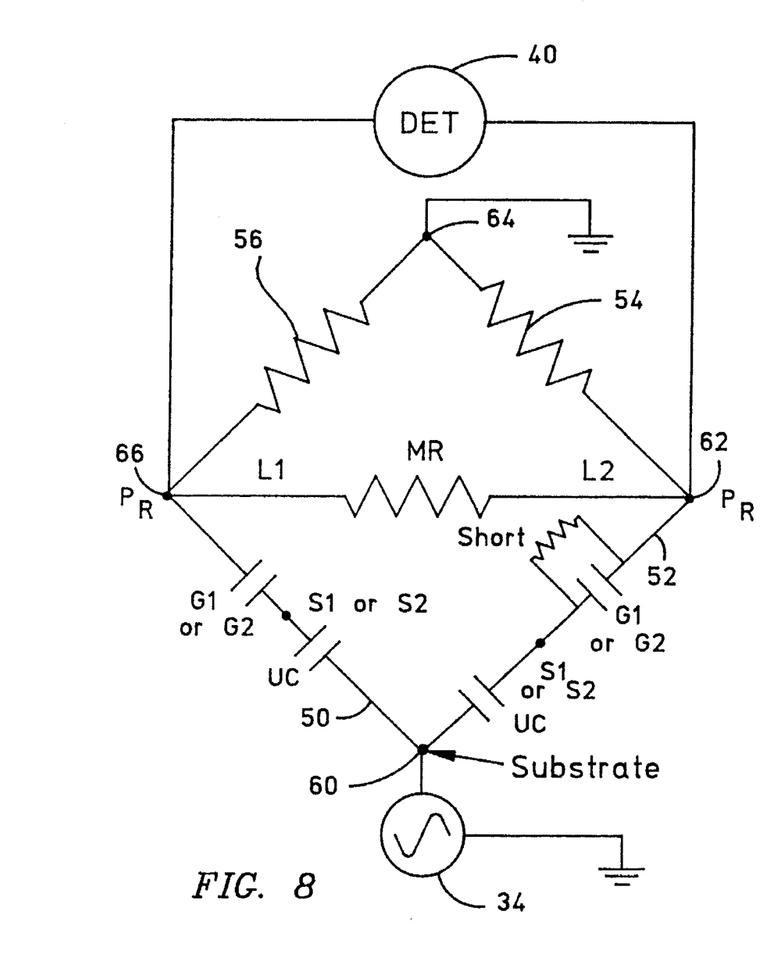
FIG. 8 is a more complete circuit diagram of the embodiment shown in FIG. 5 with an internal shield short shown between the second lead L2 and the first shield layer S1.

FIG. 8 is a more complete schematic illustration of the embodiment shown in FIG. 5 with a short circuit shown in one of the branches of the bridge circuit. FIG. 8 shows first, second, third and fourth consecutive branches 50, 52, 54 and 56 which are interconnected by consecutively arranged terminals 60, 62, 64 and 66, the branches 54 and 56 being the same as branches 30 and 32 in FIG. 5. The second and fourth terminals 62 and 66 comprise the read pads $P_R$ and the first terminal 60 comprises the substrate. The signal generator 34 is connected across the first and third terminals 60 and 64. This may be accomplished by connecting one end of the signal generator to the substrate 60 and connecting the other end of the signal generator and the terminal 64 to ground. The first branch 50 of the bridge circuit includes a capacitance G1 which is due to the first gap layer G1 between the first shield layer S1 and the first lead L1. The second branch 52 of the bridge circuit includes the same capacitance G1 except the first gap layer G1 is between the first shield layer S1 and the second lead L2. The bridge circuit is completed by connecting the detector 40 across the read pads $P_R$. It has been found that when each of the resistances R is about 170 ohms the detector operates quite well as a differential voltage amplifier for detecting an impedance imbalance between the read pads $P_R$. This imbalance is caused by one or more shield shorts in either of the branches 50 and 52 such as the shield short shown in the branch 52 across the first gap layer G1. As described hereinabove this is caused by a pinhole in the first gap layer G1 which can cause the second lead L2 to electrically contact the first shield layer S1. If there is conductive material smeared between the first shield S1 and the MR at the ABS this will short circuit across the first gap layer G1 to cause an impedance imbalance which will be detected by the detector 40. Conductive smearing between the second shield layer S2 and the MR will be described hereinafter. It should be noted that the branches 50 and 52 comprise components of the magnetic head and that the branches 54 and 56, the generator 34 and the detector 40 are external to the head. It should also be noted that the connections of the generator 34 and the detector 40 are to components exposed externally to the head, namely the substrate and the read pads $P_R$. Accordingly, by substrate injection impedance imbalances across the head at the read pads $P_R$ can be detected to indicate internal shield shorts or ABS shield shorts.

Figure 9:
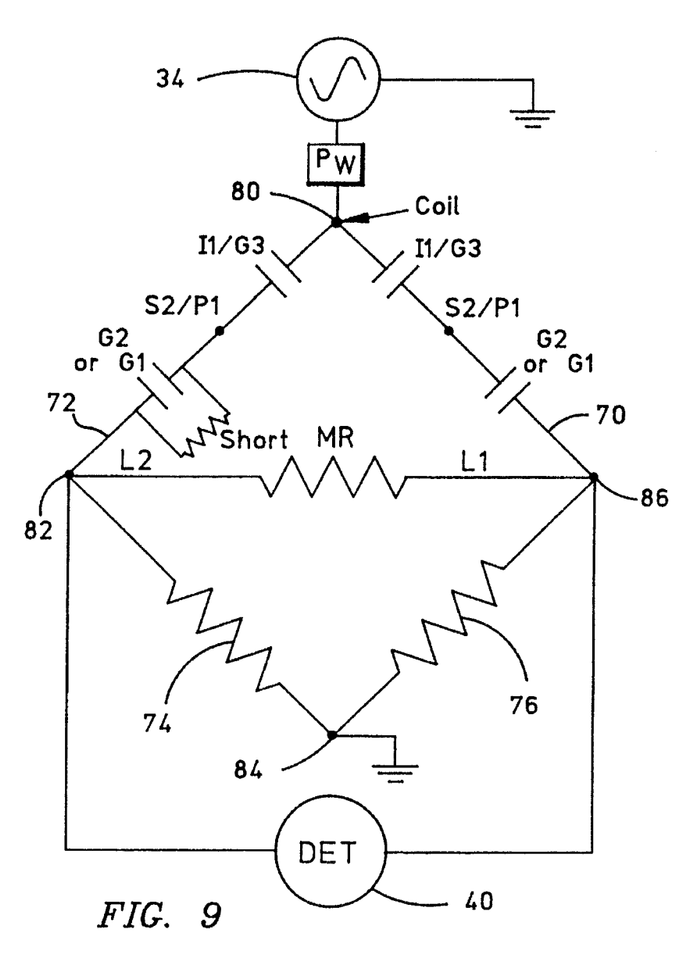
FIG. 9 is a more complete circuit diagram of the embodiment shown in FIG. 7 with an internal shield short shown between the second lead and the second shield layer S2.

FIG. 9 is a more complete circuit diagram of the diagram shown in FIG. 7. In this diagram the first, second, third and fourth branches 70, 72, 74 and 76 are consecutively connected by first, second, third and fourth terminals 80, 82, 84 and 86, the branches 74 and 76 corresponding to the branches 30 and 32 in FIG. 7. In FIG. 9 the signal generator 34 injects a signal into the coil via one of the write pads $P_W$. This results in different capacitances in the first and second branches 70 and 72 as contrasted to the capacitances in the branches 50 and 52 of the FIG. 8 embodiment. The signal is injected through the capacitance I1/G3 which is due to the first insulation layer I1 and the third gap layer G3 between the coil and the second shield layer S2. The branch 70 includes a capacitance due to gap layer 62 which is between the second shield layer S2 and the first lead L1 and the branch 72 includes a capacitance due to the gap layer G2 between the second shield layer S2 and the second lead L2. An exemplary internal shield short is shown across the second gap layer G2 in the second branch 72. This will cause an impedance imbalance in this branch and will be detected by the detector 40.

Figure 10:
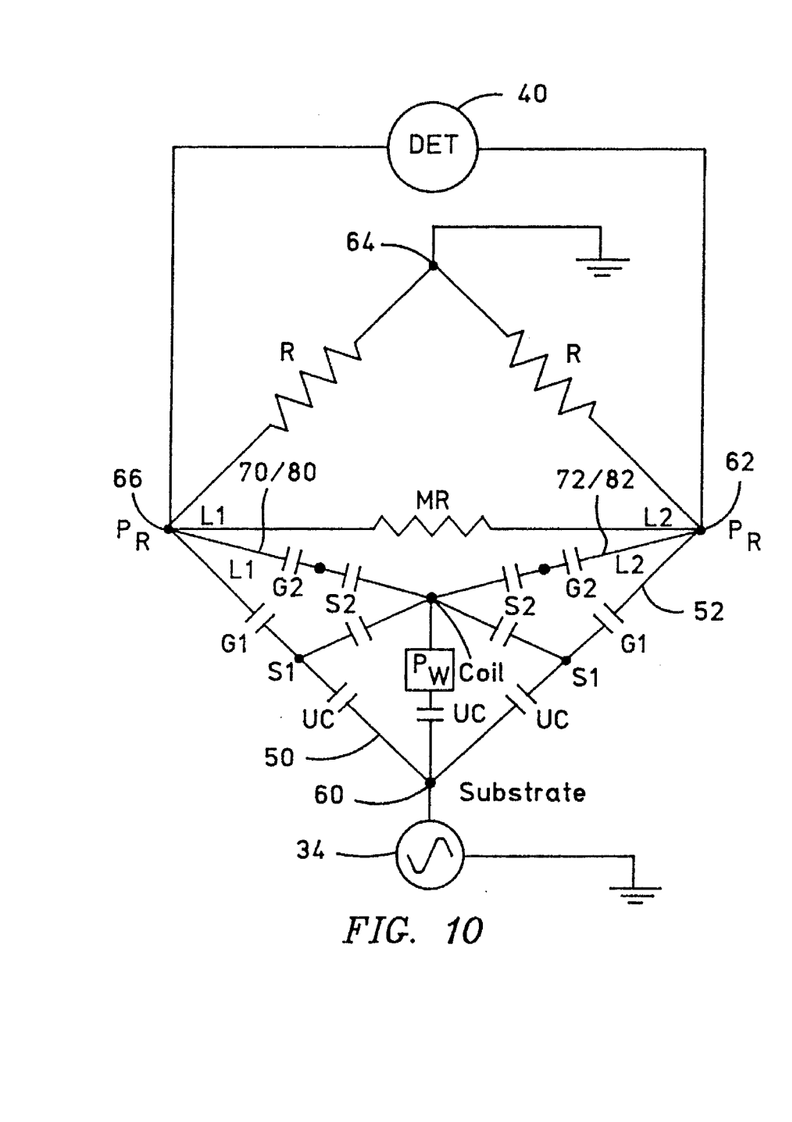
FIG. 10 is a more complete circuit diagram of the embodiment shown in FIG. 5 without any shield shorts.

It should be noted that the circuit diagrams in FIGS. 8, 9 and 10 have been simplified and that reference for the full head couplings should be to FIG. 4.

FIG. 10 is a more complete circuit diagram of the circuit diagram shown in FIG. 8. The diagram shown in FIG. 10 includes fifth and sixth branches 80 and 82 which are the same as the first and second branches 70 and 72 shown in FIG. 9. The reason for the addition of the fifth and sixth branches 80 and 82 can be seen by reference to the head components shown in the upper half of FIG. 4. The fifth and sixth branches 80 and 82 are connected in parallel with the branches 50 and 52 across the MR and the read pads $P_R$. The diagram of FIG. 10 is shown to illustrate that substrate injection will also detect shield shorts across the second gap layer G2. For example, if there is a shield short across the second gap layer G2 in the fifth branch 80 between the second shield layer S2 and the first lead L1, this will cause an impedance imbalance across the read pads $P_R$ which will be detected by the detector 40. It should be understood that a more complete circuit diagram could also be shown for FIG. 9 including branches 50 and 52 of FIG. 8 in parallel with the branches 70 and 72 across the read pads $P_R$ of FIG. 9. Accordingly, with write pad injection, as shown in FIG. 9, a shield short can also be detected across the first gap layer G1 between the first shield layer and either of the leads L1 or L2 because of impedance imbalance.

Figure 11:
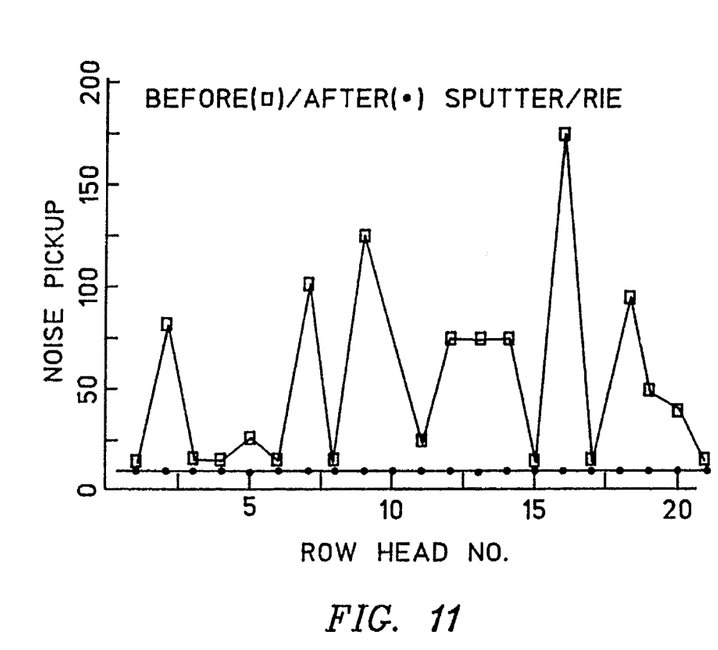
FIG. 11 shows the results of testing a series of heads at the row level during fabrication before and after removing ABS shield shorts at the ABS.

FIG. 11 is a graph of 21 heads on a row of heads during fabrication which were tested before and after ABS shield shorts at the ABS were removed. Before removing the ABS shorts the noise pickup by the present invention is shown by the open rectangle for each head. After the ABS was sputter etched to remove the conductive material between the shields and the MR the present invention showed each head to have virtually zero noise pickup as shown by the solid dots. Shield shorts at the ABS due to conductive smearing can be easily corrected whereas it is not feasible to correct internal shield shorts due to pinholes in the gap layer G1 and G2.

Obviously, other embodiments and modifications of the invention will occur to those of ordinary skill in the art in view of these teachings. Therefore, the invention is to be limited only by the following claims which include all such embodiments and modifications when viewed in conjunction with the above specification and accompanying drawings.

We claim:

1. A test circuit for testing for short circuits in a combined thin film MR read head and write head, the combined head having an MR sensor which is interconnected between first and second read pads by first and second leads, the MR sensor and the leads being sandwiched between first and second gap layers which are in turn sandwiched between first and second shield layers which are in turn sandwiched between a substrate and an insulation stack, a coil being embedded in the insulation stack and the coil being connected to first and second write pads, the test circuit comprising:

first, second, third and fourth branches and first, second, third and fourth terminals, the first and second branches being connected in series by the first terminal, the second and third branches being connected in series by the second terminal, the third and fourth branches being connected in series by the third terminal and the fourth and first branches being connected in series by the fourth terminal;

the second and fourth terminals comprising said first and second read pads;

the first branch comprising a capacitance formed by one of the gap layers which is between one of the shield layers and one of the leads;

the second branch comprising a capacitance formed by said one of the gap layers which is between said one of the shield layers and the other one of the leads;

the substrate and the first and second write pads being potential bridge components;

the first terminal comprising one of said potential bridge components;

a signal generator connected across the first and third terminals;

a detector connected across the second and fourth terminals in parallel with the MR sensor and the first and second leads.

2. A test circuit as claimed in claim 1 wherein said one of the potential bridge components is said substrate.

3. A test circuit as claimed in claim 1 wherein said one of the potential bridge components is one of the write pads.

4. A test circuit as claimed in claim 1 including:

each of the third and fourth branches having a resistance; and the resistances of the third and fourth branches collectively balancing the bridge.

5. A test circuit as claimed in claim 1 including:
one side of the signal generator being connected to the substrate; and
the other side of the signal generator and the third terminal being connected to ground.

6. A test circuit as claimed in claim 1 including:
the first branch comprising a capacitance formed by the first gap layer which is between one of the first shield layer and one of the leads;
the second branch comprising a capacitance formed by the first gap layer which is between the shield first layer and the other one of the leads;
fifth and sixth branches interconnected by a fifth terminal;
the fifth and sixth branches being connected in series across the read pads;
the fifth branch having a capacitance which is formed by the second gap layer sandwiched between the second shield layer and one of the leads; and
the sixth branch having a capacitance which is formed by the second gap layer sandwiched between the second shield layer and the other one of the leads.

7. A test circuit as claimed in claim 6 including:
each of the third and fourth branches having a resistance; and
the resistances of the third and fourth branches balancing the circuit.

8. A test circuit as claimed in claim 7 including:
one side of the signal generator being connected to the substrate; and
the other side of the signal generator and the third terminal being connected to ground.

9. A test circuit as claimed in claim 8 wherein the detector is a differential voltage amplifier.

10. A test circuit as claimed in claim 9 wherein said one of the potential bridge components is said substrate.

11. A test circuit as claimed in claim 9 wherein said one of the potential bridge components is said one of the write pads.

12. A bridge circuit for testing a thin film merged MR head, the merged MR head having an MR sensor which is interconnected between first and second read pads by first and second leads, the MR sensor and the leads being sandwiched between first and second gap layers which are in turn sandwiched between first and second shield layers which are in turn sandwiched between a substrate and an insulation stack, a coil being embedded in the insulation stack and the coil being connected to first and second write pads, the bridge circuit comprising:
at least four consecutively arranged branches which are interconnected by first, second, third and fourth consecutively arranged terminals;
one of the substrate or one of the write pads forming said first terminal;
the first and second read pads forming said second and fourth terminals;
a signal generator connected between the first and third terminals; and
a detector connected between the second and fourth terminals.

13. A bridge circuit as claimed in claim 12 wherein the substrate forms said first terminal.

14. A bridge circuit as claimed in claim 12 wherein one of the write pads forms said first terminal.

15. A bridge circuit as claimed in claim 12 wherein the detector is a differential voltage amplifier.

16. A bridge circuit for testing for short circuits in a thin film MR head which is mounted on a substrate, the MR head having an MR sensor which is interconnected between first and second read pads by first and second leads, the MR sensor and the leads being sandwiched between first and second gap layers which are in turn sandwiched between first and second shield layers, the bridge circuit comprising:
at least four consecutively arranged branches which are interconnected by first, second, third and fourth consecutively arranged terminals;
the first terminal being connected to the substrate;
a signal generator connected across the first and third terminals;
the second and fourth terminals being said first and second read pads; and
a detector connected across the first and second read pads.

17. A bridge circuit as claimed in claim 16 including:
each of the third and fourth branches having a resistance; and
the resistances of the third and fourth branches collectively balancing the bridge.

18. A bridge circuit as claimed in claim 16 including:
one side of the signal generator being connected to the substrate; and
the other side of the signal generator and the third terminal being connected to ground.

19. A bridge circuit as claimed in claim 16 including:
the detector being a differential voltage amplifier.

20. A bridge circuit as claimed in claim 19 including:
the first branch having a capacitance formed by the first gap layer which is sandwiched between the first shield layer and one of the leads; and
the second branch having a capacitance formed by the first gap layer which is sandwiched between the first shield layer and the other one of the leads.

21. A bridge circuit as claimed in claim 20 including:
fifth and sixth branches interconnected by a fifth terminal;
the fifth and sixth branches being connected in series across the read pads;
the fifth branch having a capacitance which is formed by the second gap layer sandwiched between the second shield layer and one of the leads; and
the sixth branch having a capacitance which is formed by the second gap layer sandwiched between the second shield layer and the other one of the leads.

22. A bridge circuit as claimed in claim 21 including:
each of the third and fourth branches having a resistance; and
the resistances of the third and fourth branches balancing the bridge.

23. A bridge circuit as claimed in claim 22 including:
one side of the signal generator being connected to the substrate; and
the other side of the signal generator and the third terminal being connected to ground.

24. A bridge circuit as claimed in claim 23 wherein the detector is a differential voltage amplifier.

25. A circuit for testing for short circuits in a thin film MR head which is mounted on a substrate, the MR head having an MR sensor which is interconnected between first and second read pads by first and second leads, the MR sensor and the leads being sandwiched between first and second gap layers which are in turn sandwiched between first and second shield layers, the circuit comprising:

first and second resistances connected in series across the first and second read pads;

a signal generator;

one side of the signal generator being electrically connected between the first and second resistances and the other side of the signal generator being connected to the substrate; and a detector connected across the first and second read pads.

26. A bridge circuit as claimed in claim 25 wherein the detector is a differential voltage amplifier.

27. A circuit for testing for short circuits in a thin film MR head which is mounted on a substrate, the MR head having an MR sensor which is interconnected between first and second leads, the leads extending from the MR sensor to first and second read pads respectively, the MR sensor and the leads being sandwiched between first and second gap layers which are in turn sandwiched between first and second shield layers, the circuit comprising:

an AC signal generator connected across components of the MR head for generating an AC signal across the first gap layer between the first shield and the first and second leads and across the second gap layer between the second shield and the first and second leads; and a detector connected across the first and second read pads for detecting an imbalance in signal due to short circuiting of either lead with respect to either shield layer.

28. A circuit as claimed in claim 27 wherein the AC signal generator is connected to said substrate.

29. A circuit as claimed in claim 28 including:

one side of the signal generator being connected to the substrate; and the other side of the signal generator being connected to ground.

30. A circuit as claimed in claim 29 wherein the detector is a differential voltage amplifier.

31. A method for testing a combined thin film MR read head and write head for short circuits, the combined head having an MR sensor which is interconnected between first and second read pads by first and second leads, the MR sensor and the leads being sandwiched between first and second gap layers which are in turn sandwiched between first and second shield layers which are in turn sandwiched between a substrate and an insulation stack, a coil being embedded in the insulation stack and the coil being connected to first and second write pads, the method comprising:

inducing an AC signal across the first gap layer between the first shield layer and the first and second leads and across the second gap layer between the second shield layer and the first and second leads; and detecting an electrical imbalance across the read pads.

32. A method for testing as claimed in claim 31 wherein the step of inducing an AC signal comprises the steps of:

connecting one side of a signal generator to the substrate or one of the write pads and the other end of the signal generator to ground; and connecting each of the read pads to ground via a respective resistance.

33. A method for testing as claimed in claim 31 wherein said one side of the signal generator is connected to the substrate.

34. A method for testing as claimed in claim 31 wherein said one side of the signal generator is connected to one of the write pads.

35. A method for testing as claimed in claim 31 wherein the step of detecting comprises connecting a differential amplifier across the read pads.

* * * * *